(12) United States Patent
Lee et al.

(10) Patent No.: US 12,652,843 B2
(45) Date of Patent: Jun. 9, 2026

(54) HIGH BAND-GAP DEVICES WITH A DOPED HIGH BAND-GAP GATE ELECTRODE EXTENSION

(71) Applicant: Texas Instruments Incorporated, Dallas, TX (US)

(72) Inventors: Dong Seup Lee, McKinney, TX (US); Chang Soo Suh, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 619 days.

(21) Appl. No.: 17/885,879

(22) Filed: Aug. 11, 2022

(65) Prior Publication Data

US 2024/0055488 A1 Feb. 15, 2024

(51) Int. Cl.
| | |
|---|---|
| *H10D 62/85* | (2025.01) |
| *H01L 21/285* | (2006.01) |
| *H10D 64/01* | (2025.01) |
| *H10D 64/68* | (2025.01) |

(52) U.S. Cl.
CPC ..... *H10D 62/8503* (2025.01); *H10D 64/0124* (2026.01); *H10D 64/693* (2025.01)

(58) Field of Classification Search
CPC .. H10D 64/311; H10D 64/411; H10D 30/015; H10D 30/71; H10D 62/113; H10D 62/8503; H10D 30/4732
See application file for complete search history.

(56) References Cited

U.S. PATENT DOCUMENTS

| | | | |
|---|---|---|---|
| 2008/0296618 A1 | 12/2008 | Suh | |
| 2013/0083570 A1 | 4/2013 | Imada | |
| 2014/0103360 A1 | 4/2014 | Hikita | |
| 2015/0287713 A1 | 10/2015 | Morita | |
| 2020/0312964 A1* | 10/2020 | Shibata | H10D 30/477 |
| 2021/0098615 A1* | 4/2021 | Kwan | H10D 30/472 |
| 2022/0045203 A1* | 2/2022 | Chang | H10D 84/82 |
| 2022/0216332 A1* | 7/2022 | Banerjee | H10D 30/475 |
| 2022/0376041 A1* | 11/2022 | Hu | H01L 21/2654 |

FOREIGN PATENT DOCUMENTS

| | | | |
|---|---|---|---|
| CN | 113287200 B | | 7/2022 |
| JP | 2016033965 A | * | 3/2016 |
| WO | 2022113536 A1 | | 6/2022 |

OTHER PUBLICATIONS

International Search Report dated Dec. 7, 2023.

* cited by examiner

*Primary Examiner* — Davienne N Monbleau
*Assistant Examiner* — Emily Farmer
(74) *Attorney, Agent, or Firm* — Yudong Kim; Frank D. Cimino

(57) ABSTRACT

A microelectronic device includes a GaN FET on a substrate such as silicon and a buffer layer of p-type GaN semiconductor material. The GaN FET includes a gate electrode extension of p-type GaN semiconductor material in electrical contact with the gate electrode. The gate electrode extension of p-type GaN semiconductor material in electrical contact with the gate electrode may improve the GaN FET characteristics such as off state leakage, subthreshold voltage and post stress Vt shift.

20 Claims, 7 Drawing Sheets

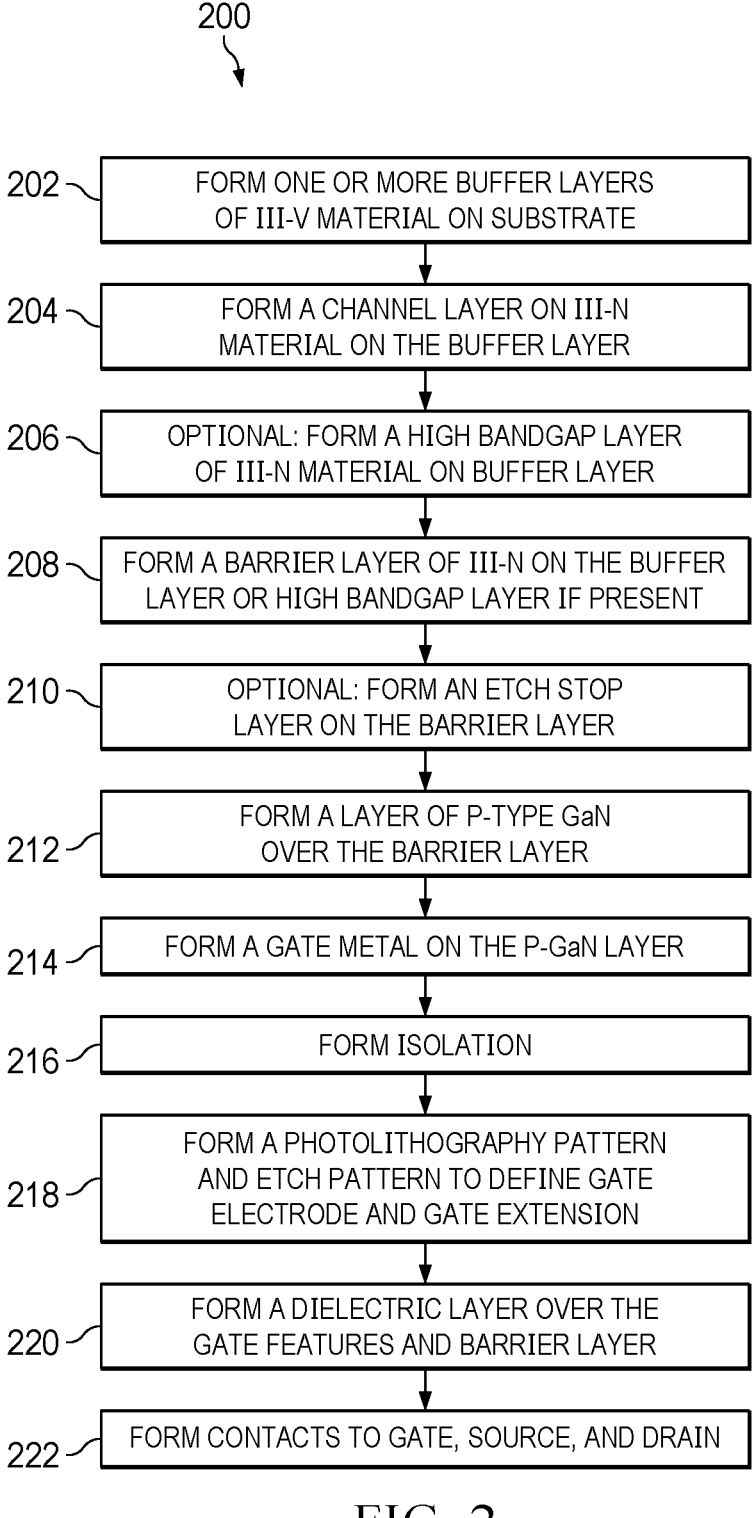

200

202 — FORM ONE OR MORE BUFFER LAYERS OF III-V MATERIAL ON SUBSTRATE

204 — FORM A CHANNEL LAYER ON III-N MATERIAL ON THE BUFFER LAYER

206 — OPTIONAL: FORM A HIGH BANDGAP LAYER OF III-N MATERIAL ON BUFFER LAYER

208 — FORM A BARRIER LAYER OF III-N ON THE BUFFER LAYER OR HIGH BANDGAP LAYER IF PRESENT

210 — OPTIONAL: FORM AN ETCH STOP LAYER ON THE BARRIER LAYER

212 — FORM A LAYER OF P-TYPE GaN OVER THE BARRIER LAYER

214 — FORM A GATE METAL ON THE P-GaN LAYER

216 — FORM ISOLATION

218 — FORM A PHOTOLITHOGRAPHY PATTERN AND ETCH PATTERN TO DEFINE GATE ELECTRODE AND GATE EXTENSION

220 — FORM A DIELECTRIC LAYER OVER THE GATE FEATURES AND BARRIER LAYER

222 — FORM CONTACTS TO GATE, SOURCE, AND DRAIN

FIG. 2

HIGH BAND-GAP DEVICES WITH A DOPED HIGH BAND-GAP GATE ELECTRODE EXTENSION

FIELD

This disclosure relates to the field of microelectronic devices. More particularly, but not exclusively, this disclosure relates to microelectronic devices having a layout including a gate electrode extension inside the device active region for improved leakage and subthreshold characteristics.

BACKGROUND

Semiconductor components are being continually improved to operate at higher potentials where gate leakage is critical to device performance. Fabricating semiconductor components that have low leakage at increasingly higher potentials is challenging.

SUMMARY

This summary is provided to introduce a brief selection of disclosed concepts in a simplified form that are further described below in the detailed description including the drawings provided. This summary is not intended to limit the claimed subject matter's scope.

Disclosed examples include microelectronic devices including a gallium nitride field effect transistor (GaN FET) with a gate layout design which contains a p-type GaN gate electrode extension within the active region of the microelectronic device for improved leakage and subthreshold performance. Disclosed examples provide an associated process flow for forming such integrated GaN FET microelectronic devices.

BRIEF DESCRIPTION OF THE VIEWS OF THE DRAWINGS

FIG. 2 is a flow chart of the formation of the GaN FET shown in FIG. 1A through FIG. 1C.

DETAILED DESCRIPTION

Figure 1A:
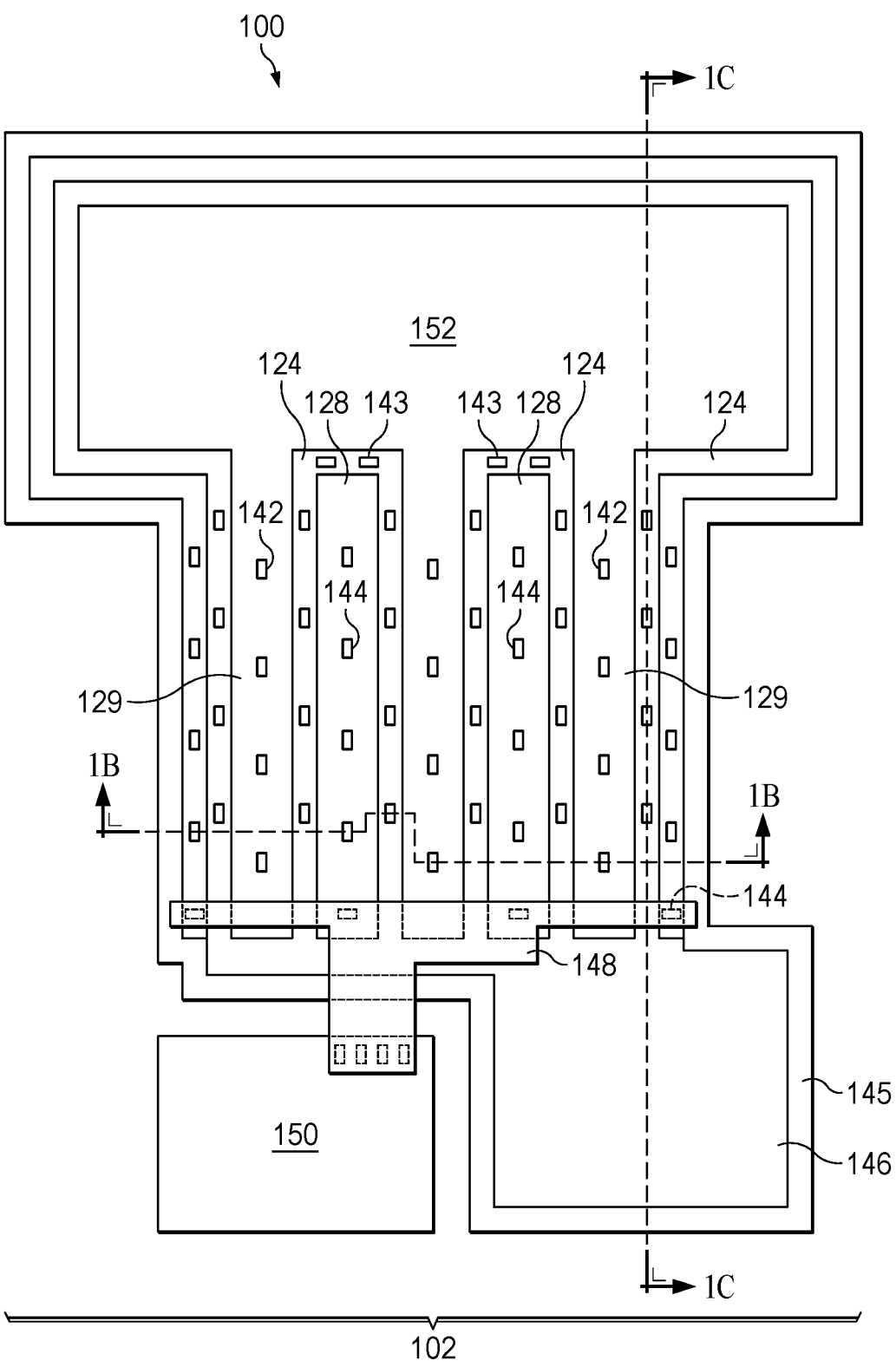
FIG. 1A is a top-down view of GaN FET including a gate electrode extension.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three-dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

For the purposes of this description, the term "III-N" is understood to refer to semiconductor materials in which group III elements, that is, aluminum, gallium and indium, and possibly boron, provide a portion of the atoms in the semiconductor material and nitrogen atoms provide another portion of the atoms in the semiconductor material. Examples of III-N semiconductor materials are gallium nitride, boron gallium nitride, aluminum gallium nitride, indium nitride, and indium aluminum gallium nitride. Terms describing elemental formulas of materials do not imply a particular stoichiometry of the elements. For example, aluminum gallium nitride may be written as AlGaN, which covers a range of relative proportions of aluminum and gallium.

It is noted that terms such as top, bottom, over, above, and under may be used in this disclosure. These terms should not be construed as limiting the position or orientation of a structure or element, but should be used to provide spatial relationship between structures or elements. The terms "lateral" and "laterally" refer to directions parallel to a plane of top surface of the channel layer.

An enhanced mode or depletion mode gallium nitride field effect transistor (GaN FET), is a high band-gap (high band-gap being more than 2 eV) transistor which may have a floating p-type doped III-N layer herein referred to as a p-type GaN layer between a gate metal layer and the channel layer. A gate for the GaN-FET consists of a first portion of the p-type GaN layer and a first portion of the gate metal layer herein referred to as the gate electrode p-type GaN stack. The p-type GaN layer is floating due to the Schottky diode nature of contacts to the gate electrode p-type GaN stack. Because the channel potential of a GaN FET with a floating p-type GaN layer between the gate metal layer and the channel layer is not directly controlled by the gate metal layer, but through the p-type GaN layer, some electrical characteristics may degrade such as subthreshold voltage, gate leakage, and off state Vt shift. The GaN-FET includes a gate electrode extension including a second portion of the p-type GaN layer and a second portion of the gate metal layer, the gate electrode extension electrically in contact with the first portion of the p-type GaN layer, wherein the p-type GaN gate electrode extension is inside of an isolation region surrounding the GaN FET. The addition of the gate electrode extension including p-GaN under the gate electrode which is within the active region of the GaN FET provides additional coupling of the p-GaN between the gate electrode and source which makes the p-GaN potential more stable against drain voltage and results in lower drain to source leakage. The increased coupling also results in a steeper subthreshold slope and improved off state Vt shift compared to a similar GaN FET without a gate electrode extension.

Figure 1B:
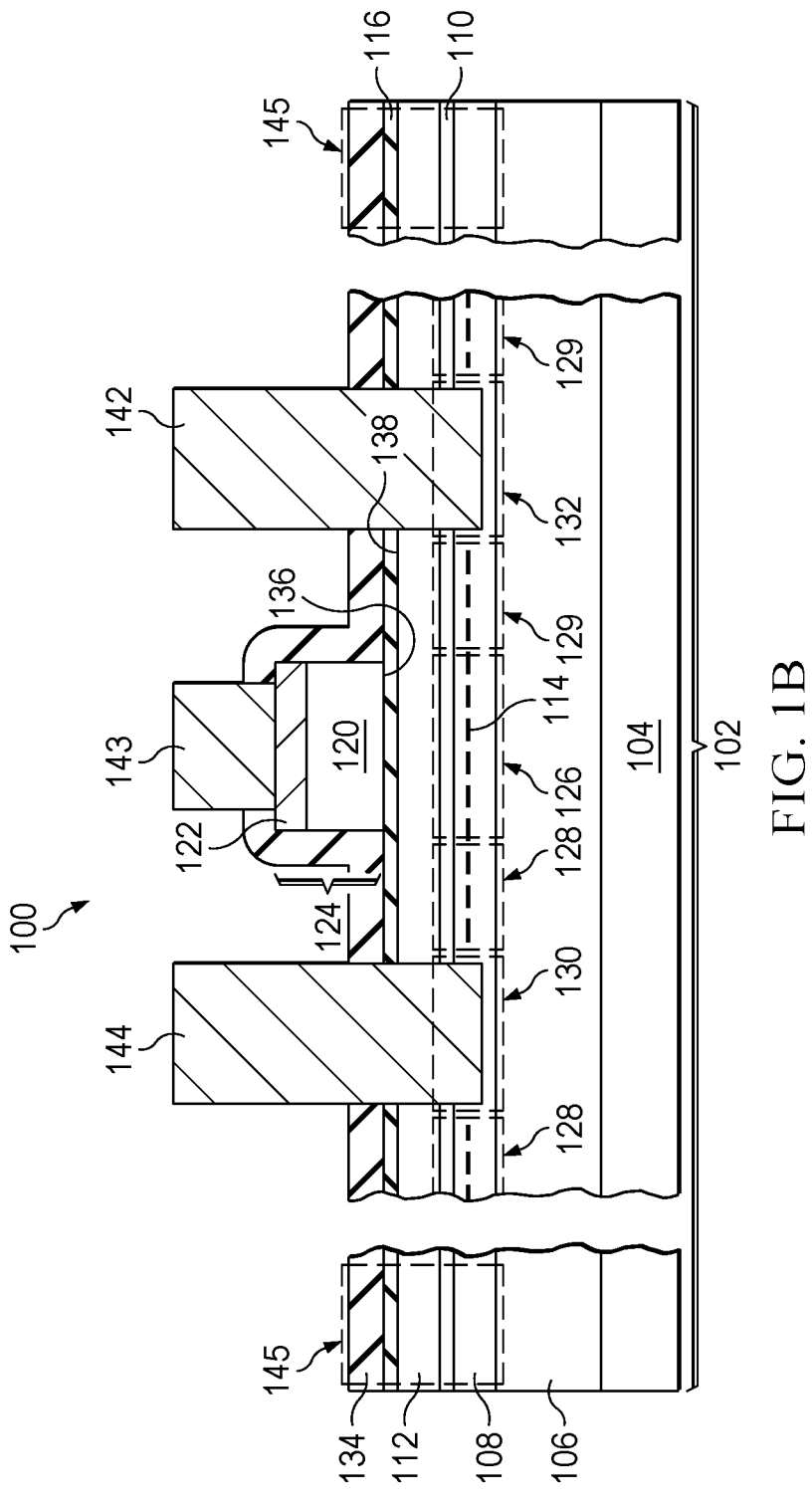
FIG. 1B is a cross section of a GaN FET.

FIG. 1A shows a top-down view of a microelectronic device 100 including a gallium nitride field effect transistor 102 (herein referred to as the GaN FET), with a gate electrode p-type GaN stack 124. The gate electrode p-type GaN stack 124 contains the p-type GaN gate electrode extension (herein referred to as the gate electrode extension) 146 which is formed concurrently with the gate electrode p-type GaN stack 124 and is electrically connected to the gate electrode p-type GaN stack 124. The gate electrode extension 146 is contained entirely within the isolation region 145 of the microelectronic device 100, the isolation region 145 forming a continuous region which surrounds the GaN FET 102 and the gate electrode extension 146. In the example shown in FIG. 1A, the gate electrode extension 146 also serves as a gate electrode bond pad region for the GaN FET 102, but other locations of the gate electrode extension 146 such as any region adjacent to the GaN FET 102 while still being electrically connected to the gate electrode p-type GaN stack 124 and being within the isolation region 145 are within the scope of the disclosure. The GaN FET 102 contains a source access region 128, and a drain access region 129 which are components of the two-dimensional electron gas (2DEG) 114 as shown in FIG. 1B. The GaN FET 102, contains the gate electrode p-type GaN stack 124 between the source access region 128 and the drain access region 129, a row of source contacts 144 over a source (not specifically shown) in the source access region 128, a row of drain contacts 142 over a drain (not specifically shown) in the drain access region 129, gate contacts 143 on the gate electrode p-type GaN stack 124, and a drain bond pad 152. Metallization have been removed for clarity except for the metallization 148 joining the source bond pad 150 to the source access regions 128.

FIG. 1B is a cross section of an enhanced mode example GaN FET structure that may be used in the microelectronic device 100 to accomplish the GaN FET 102 of FIG. 1A. A depletion mode GaN FET is within the scope of the disclosure. The gate electrode extension 146 is outside of the plane of the cross section shown in FIG. 1B. The microelectronic device 100 may be formed on a substrate 104 such as a silicon wafer, a sapphire wafer, or a silicon carbide wafer. The GaN FET 102 contains a buffer layer of III-N semiconductor material 106 (herein referred to as the buffer layer) of one or more layers of III-N semiconductor material on the substrate 104, a channel layer of III-N semiconductor material 108 (herein referred to as the channel layer), in this example gallium nitride over the buffer layer 106, an optional high bandgap layer of III-N semiconductor material 110 (herein referred to as the optional high bandgap layer) over the channel layer 108, and a barrier layer 112 of III-N semiconductor material over the optional high bandgap layer 110 if present and over the channel layer 108 if the optional high bandgap layer 110 is not present. The barrier layer 112 induces the 2DEG 114 in the channel layer 108 adjacent to the barrier layer 112. The 2DEG 114 includes a channel region 126 under the gate electrode p-type GaN stack 124.

The channel region 126 is between a drain access region 129 and a source access region 128, the drain access region 129 and the source access region 128 are located opposite but adjacent to the channel region 126. The 2DEG 114 includes a source region 130 in an area for a source of the GaN FET 102. The source region 130 is laterally separated from the channel region 126 by the source access region 128. The 2DEG 114 includes a drain region 132 in an area for a drain of the GaN FET 102. The drain region 132 is laterally separated from the channel region 126 by the drain access regions 129, and is located opposite from the source region 130.

The GaN FET 102 may contain an optional etch stop layer 116 on the barrier layer 112. The gate electrode p-type GaN stack 124 is defined on the barrier layer 112 of the GaN FET. The gate electrode p-type GaN stack 124 is composed of a p-type GaN layer 120 on the barrier layer 112 or on the optional etch stop layer 116 if present and the gate metal layer 122 on the p-type GaN layer 120. Portions of the gate metal layer 122 and the p-type GaN layer 120 are etched away during semiconductor processing leaving a gate electrode p-type GaN stack 124 and the gate electrode extension (shown in FIG. 1A). The gate electrode p-type GaN stack 124, has a bottom surface 136 adjacent to the barrier layer 112 or optional etch stop layer 116 if present, which does not extend past a top surface 138 of the barrier layer 112, located opposite from the channel layer 108. The GaN FET 102 contains a dielectric layer 134 over the gate electrode p-type GaN stack 124. The GaN FET 102 contains a gate contact 143, as well as a drain contact 142 and a source contact 144. The gate contact 143 may be formed of aluminum, tungsten or TiW by way of example. The gate contact 143 makes electrical contact to the gate electrode p-type GaN stack 124. Both the drain contact 142 and the source contact 144 make electrical contact through the barrier layer 112 and the optional high bandgap layer 110 to the channel layer 108. The GaN FET 102 contains an isolation region 145. The isolation region 145 may be formed by a implant process with a ion such argon, fluorine, or nitrogen, which causes damage to the barrier layer 112, the optional high bandgap layer 110, the channel layer 108, and a portion of the buffer layer 106 in the isolation region 145, or by a plasma etch process which removes the barrier layer 112, the optional high bandgap layer 110, the channel layer 108, and removes a portion of the buffer layer 106 in the isolation region 145.

Figure 1C:
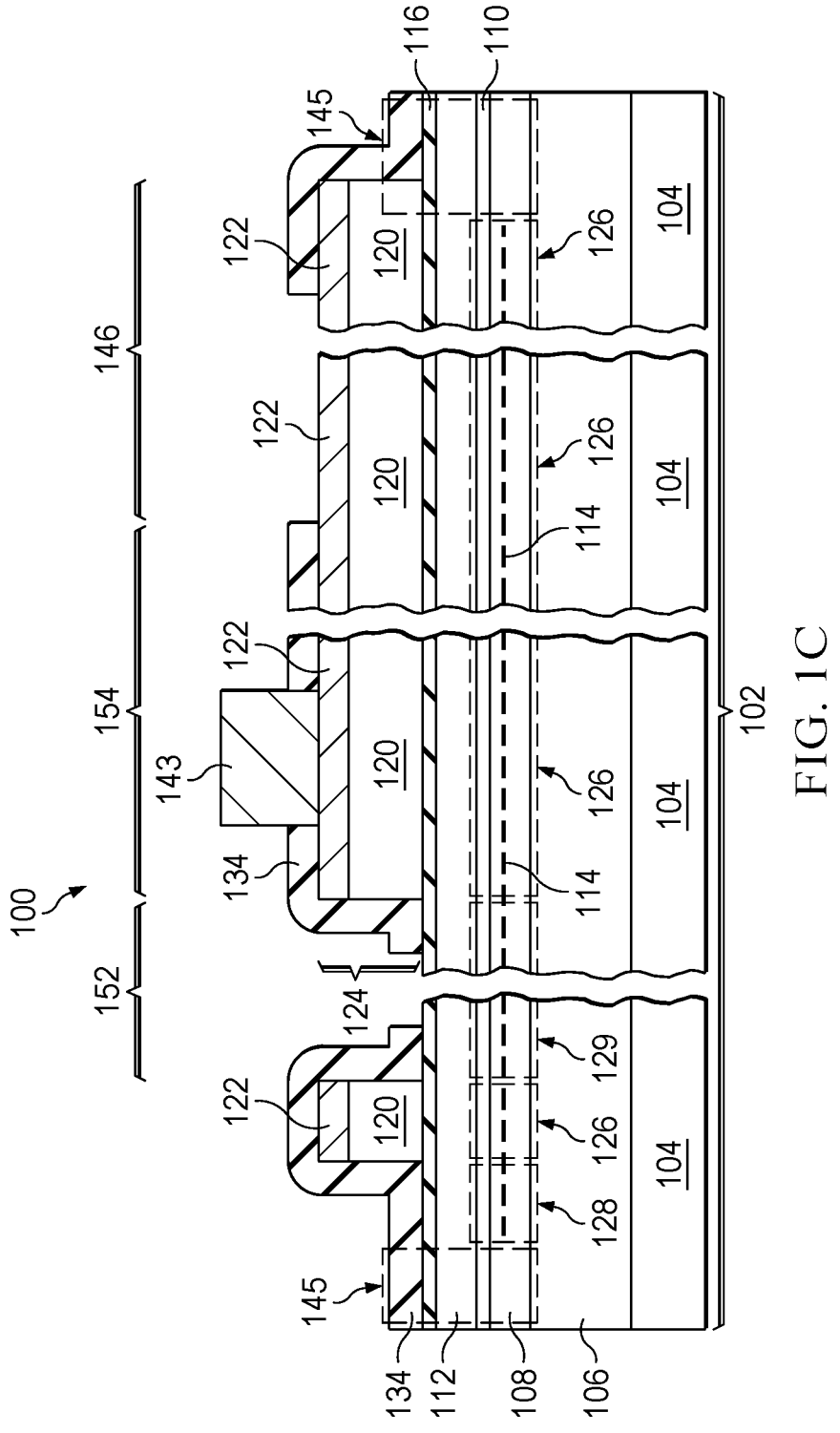
FIG. 1C is a cross section of a GaN FET.

FIG. 1C shows a cross section of the microelectronic device 100 including the gate electrode extension 146, the drain bond pad 152, and the gate electrode p-type GaN stack 124 through the gate electrode length 154. The microelectronic device 100 may include a substrate 104 such as a silicon wafer, a sapphire wafer, or a silicon carbide wafer. The GaN FET 102 (outside the plane of the cross section) contains a buffer layer of 106 of one or more layers of III-N semiconductor material on the substrate 104, a channel layer 108, over the buffer layer 106, an optional high bandgap layer 110 over the channel layer 108, and a barrier layer 112 of III-N semiconductor material over the optional high bandgap layer 110 if present and over the channel layer 108 if the optional high bandgap layer 110 is not present. The barrier layer 112 induces the 2DEG 114 in the channel layer 108 adjacent to the barrier layer 112. An optional etch stop layer 116, may be formed over the barrier layer 112. The 2DEG 114 includes a channel region 126 under the gate electrode gate electrode p-type GaN stack 124, the gate electrode p-type GaN stack 124 consisting of the p-type GaN layer 120 and the gate metal layer 122. A gate contact 143 is shown contacting the gate electrode p-type GaN stack 124 through the dielectric layer 134. In FIG. 1C, the 2DEG 114 under the drain bond pad 152, and areas not part of the channel region 126 induces a drain access region 129.

At the left and right edges of FIG. 1C, are isolation regions 145 which are part of the isolation region 145 which surrounds the microelectronic device 100 as shown in FIG. 1A. A source access region 128 is adjacent to the isolation region 145 at the left most edge of FIG. 1C, and a channel region 126 with an associated p-type GaN layer 120 and gate metal layer 122 are above the source access region 128. A drain bond pad 152, provides a region to bond the drain access region 129 of FIG. 1B to a semiconductor package (not specifically shown). FIG. 1C shows a gate electrode length 154 which spans between the drain bond pad 152 and the gate electrode extension 146. In the example shown, the gate electrode extension 146 also serves as the gate bond pad. The p-type GaN layer 120 and the gate metal layer 122 are continuous between the edge of the gate electrode length 154 and the gate electrode extension 146.

FIG. 2 presents a flowchart of an example method 200 of forming the microelectronic device 100 of FIG. 1A and FIG. 1B. The method 200 includes step 202, which may include forming a buffer layer 106 on the substrate 104. In versions of this example in which the substrate 104 is implemented as a silicon wafer or a sapphire wafer, the buffer layer 106 may include a nucleation layer having a stoichiometry that includes aluminum, to match a lattice constant of the substrate 104. The buffer layer 106 may further include sublayers of gallium aluminum nitride with decreasing aluminum content, culminating in an unintentionally doped gallium nitride layer. The buffer layer 106 on silicon or sapphire may be 1 micron to several microns thick. In versions of this example in which the substrate 104 is implemented as a silicon carbide wafer, the buffer layer 106 may be thinner, due to a closer match in lattice constant between gallium nitride and silicon carbide. The buffer layer 106 may be formed by a buffer metal organic vapor phase epitaxy (MOVPE) process with several operations to form the nucleation layer and sublayers. The buffer layer 106 overlaps an area for the GaN FET 102.

The method 200 continues with step 204 which includes forming a channel layer 108 of III-N semiconductor material on the buffer layer 106. The channel layer 108 includes gallium and nitrogen, and may include primarily gallium nitride, with optional trace amounts of other group III elements, such as aluminum or indium. The channel layer 108 may be formed by a channel metalorganic vapor-phase epitaxy (MOVPE) process using a gallium containing gas reagent and a nitrogen containing gas reagent. The substrate 104 may be heated to 900° C. to 1100° C. during the channel MOVPE process. The gallium containing gas reagent may be implemented as trimethylgallium or triethylgallium, for example. The nitrogen containing gas reagent may be implemented as ammonia, hydrazine, or 1,1 dimethylhydrazine, for example. The channel MOVPE process uses a carrier gas. The carrier gas may include primarily hydrogen gas, or may include hydrogen with another gas such as nitrogen. The channel layer 108 may be 1 nanometer to 10 nanometers thick, by way of example. In an alternate version of this example, the channel layer 108 may be formed as a last portion of the buffer layer 106. During operation of the GaN FET 102, the channel layer 108 supports the 2DEG 114.

The method 200 continues with step 206 that includes forming an optional high bandgap layer 110 of III-N semiconductor material on the channel layer 108. The optional high bandgap layer 110 includes primarily aluminum and nitrogen, to provide a higher bandgap than the barrier layer 112, which is formed subsequently. In some versions of this example, the optional high bandgap layer 110 may consist essentially of aluminum nitride, with trace amounts of other group III elements, such as gallium.

The optional high bandgap layer 110 may be formed by a high bandgap MOVPE process using an aluminum containing gas reagent and a nitrogen containing gas reagent. The aluminum containing gas reagent may be implemented as trimethylaluminum or triethylaluminum, for example. The nitrogen containing gas reagent may be implemented as ammonia, hydrazine, or 1,1 dimethylhydrazine, as disclosed in reference to forming the channel layer 108. The substrate 104 may be heated to 900° C. to 1100° C. during the high bandgap MOVPE process. The high bandgap MOVPE process uses a carrier gas. The carrier gas may include primarily hydrogen gas, or may include hydrogen with another gas such as nitrogen. The optional high bandgap layer 110 may be 0.5 nanometers to 3 nanometers thick, by way of example. The optional high bandgap layer 110, if formed, may improve charge confinement in a subsequently-formed 2DEG 114, by providing a deeper quantum well in the channel layer 108, advantageously providing an increased free charge carrier density in the 2DEG 114.

The method 200 continues with step 208 which includes forming the barrier layer 112 of III-N semiconductor material over the channel layer 108, or on the optional high bandgap layer 110, if present. The barrier layer 112 may include aluminum and nitrogen. In one version of this example, the barrier layer 112 may also include gallium $(Al_xGa_yN)$ where the sum of x and y equals one, and x and y can range between 0.01 and 0.99. In another version of this example, the barrier layer 112 may have a stoichiometry of $Al_{0.83}In_{0.17}N$, within a few atomic percent, which provides a close lattice match to gallium nitride. In a further version, the barrier layer 112 may include gallium and indium; the gallium may improve uniformity of the indium in the barrier layer 112. The barrier layer 112 may have a thickness of 1 nanometer to 600 nanometers.

The barrier layer 112 may be formed by a barrier MOVPE process using an aluminum containing gas reagent and a nitrogen containing gas reagent. The aluminum containing gas reagent may be implemented as trimethylaluminum or triethylaluminum, for example. The nitrogen containing gas reagent may be implemented as ammonia, hydrazine, or 1,1 dimethylhydrazine, as disclosed in reference to forming the channel layer 108.

In versions of this example in which the barrier layer 112 includes gallium, the barrier MOVPE process uses a gallium containing gas reagent in addition to the aluminum containing gas reagent and the nitrogen containing gas reagent. The gallium containing gas reagent may be implemented as trimethylgallium or triethylgallium, as disclosed in reference to forming the channel layer 108. In versions of this example in which the barrier layer 112 includes indium, the barrier MOVPE process uses an indium containing gas reagent. The indium containing gas reagent may be implemented as trimethylindium or triethylindium, for example. The barrier MOVPE process uses a carrier gas. The carrier gas may include primarily hydrogen gas, or may include hydrogen with another gas such as nitrogen. The substrate 104 may be heated to 900° C. to 1100° C. during the barrier MOVPE process.

The barrier layer 112 induces the 2DEG 114 in the channel layer 108 adjacent to the barrier layer 112. The stoichiometry and thickness of the barrier layer 112 may provide a free charge carrier density of $3 \times 10^{12}$ cm$^{-2}$ to $2 \times 10^{13}$ cm$^{-2}$, to provide a desired on-state resistance for the GaN FET 102.

The method 200 continues with step 210 which includes forming an optional etch stop layer 116 on the barrier layer 112. The optional etch stop layer 116 has a higher aluminum content than the barrier layer 112. The optional etch stop layer 116 may include a primarily aluminum nitride semiconductor material. The optional etch stop layer 116 may be 0.5 nanometers to 3 nanometers thick, and may be formed by an etch stop MOVPE process similar to the high bandgap MOVPE process used to form the optional high bandgap layer 110. The optional etch stop layer 116 may advantageously reduce or eliminate etching of the barrier layer 112 during a subsequent gate etch process.

The method 200 continues with step 212 which includes forming p-type III-N semiconductor material referred to herein as p-type GaN layer 120 as a layer over the barrier layer 112. The p-type GaN layer 120 may include primarily gallium nitride, with magnesium dopant to provide p-type conductivity. In some versions of this example, the p-type GaN layer 120 may include other group III elements, such as aluminum or indium, at less than 10 atomic percent.

The p-type GaN layer 120 may be formed by a MOVPE process using a gallium containing gas reagent, a nitrogen containing gas reagent, and a p-type dopant gas. The gallium containing gas reagent may be implemented as trimethylgallium or triethylgallium, for example. The nitrogen containing gas reagent may be implemented as ammonia, hydrazine, or 1,1 dimethylhydrazine, as disclosed in reference to forming the channel layer 108. The p-type dopant gas reagent may be implemented as bis(cyclopentadienyl)magnesium, by way of example. Other sources of magnesium containing gas reagents are within the scope of this example. Further, other implementations of the p-type dopant gas to provide p-type dopants other than magnesium are also within the scope of this example. In versions of this example in which the p-type dopant is implemented as magnesium, the magnesium concentration in the p-type GaN layer 120 may be $1 \times 10^{17}$ cm$^{-3}$ to $1 \times 10^{20}$ cm$^{-3}$, to provide a desired threshold potential for the GaN FET 102.

In versions of this example in which the p-type GaN layer 120 includes aluminum, the MOVPE process uses an aluminum containing gas reagent. The aluminum containing gas reagent may be implemented as trimethylaluminum or triethylaluminum, as disclosed in reference to forming the barrier layer 112. In versions of this example in which the p-type GaN layer 120 includes indium, the MOVPE process uses an indium-containing gas reagent. The indium containing gas reagent may be implemented as trimethylindium or triethylindium, as disclosed in reference to forming the barrier layer 112. The p-type GaN layer 120 formation MOVPE process uses a carrier gas. The carrier gas may include primarily hydrogen gas, or may include hydrogen with another gas such as nitrogen. The substrate 104 may be heated to 900° C. to 1100° C. during the MOVPE process.

The p-type GaN layer 120 may be 5 nanometers to 500 nanometers thick, to provide a desired threshold potential for the GaN FET 102. The p-type GaN layer 120 reduces the free charge carrier density in the 2DEG 114 by 25 percent to 99 percent, as a result of the work function of the gate layer reducing the quantum well in the channel layer 108. The 2DEG 114 retains a finite free charge carrier density of electrons after the p-type GaN layer 120 is formed.

The method 200 continues with step 214 which includes forming a gate metal layer 122 on the p-type GaN layer 120. The gate metal layer 122 may be one of a group selected from titanium, nickel, titanium nitride, titanium tungsten, and tungsten. Other metals for the gate metal layer 122 are within the scope of the disclosure. The gate metal layer 122 may be deposited by a sputtering process, a plasma deposition process, or a CVD process. The gate metal layer 122 is between 50 nanometers to 3 microns by way of example.

The method 200 continues with step 216 which includes forming an isolation region 145 surrounding the GaN FET 102. To form the isolation region 145, a photolithography step is used to cover the GaN FET 102 including the gate electrode extension 146 with photoresist, leaving the isolation region 145 exposed to an isolation region implant (not specifically shown). The isolation region implant may include an implant of argon, fluorine, or nitrogen ions implanted with an energy of between 100 kilo-electron volts (keV) and 300 keV with an implant dose of $1 \times 10^{14}$ ions/cm$^2$ to $1 \times 10^{16}$ ions/cm$^2$. The isolation region implant creates an amorphous region of damage during the formation of the isolation region 145 which results in increased resistance of the exposed layers such that acceptable isolation characteristics are achieved for the functionality of the GaN FET 102. The isolation region 145 may also be formed using a photolithography step to cover the GaN FET 102 leaving the isolation region 145 exposed, followed by a plasma etch process which removes the barrier layer 112, the optional high bandgap layer 110, the channel layer 108, and removes a portion of the buffer layer 106.

The method 200 continues with step 218 which includes patterning and etching the gate metal layer 122 and the p-type GaN layer 120 to define the gate electrode p-type GaN stack 124. In the gate electrode p-type GaN stack 124 formation process, a gate mask (not specifically shown) is formed on the gate metal layer 122, the gate mask covering an area of the gate metal layer 122 and underlying p-type GaN layer 120. In one version of this example, the gate mask may include photoresist, formed directly by a photolithographic process. The gate mask may include organic anti-reflection material such as a bottom anti-reflection coat (BARC) layer under the photoresist. The BARC layer may be patterned after the photolithographic process is completed. In another version of this example, the gate mask may include inorganic hard mask material, such as silicon dioxide or silicon nitride. In a further version, the gate mask may include metal hard mask material, such as silicon nitride by way of example. The hard mask material, inorganic or metal, may be patterned by forming a photoresist pattern over the hard mask material, followed by etching the hard mask material using a reactive ion etch (RIE) process using fluorine radicals or an ion milling process. A hard mask material in the gate mask may provide improved control of the lateral dimension of the gate electrode p-type GaN stack 124. The gate electrode p-type GaN stack 124 formation process continues with a gate etch process (not specifically shown) which removes the gate metal layer 122 and p-type GaN layer 120 where exposed by the gate mask, leaving the gate metal layer 122 and p-type GaN layer 120 under the gate mask to form the gate electrode p-type GaN stack 124. The gate etch process may be performed in an inductively coupled plasma (ICP) etcher, which generates a plasma containing chemically reactive neutral species, ions, and electrons. The gate etch process includes a chemical etchant species, a physical etchant species, and an aluminum passivating species. The chemical etchant species may be implemented as chlorine radicals, or bromine radicals, for example. The chlorine radicals may be provided by chlorine gas, silicon tetrachloride, boron trichloride, or a combination thereof. The bromine radicals may be provided by boron tribromide, for example.

The gate electrode p-type GaN stack 124 etch process may also include physical etchant species which may be implemented by one or more ion species. Examples of the physical etchant species include fluorine ions, noble gas ions such as argon ions or helium ions, and oxygen ions. Other ion species in the physical etchant species are within the scope if this example. The fluorine ions may be provided by silicon hexafluoride, carbon tetrafluoride, or nitrogen trifluoride, for example. The noble gas ions may be provided by argon gas or helium gas. The oxygen ions may be provided by oxygen gas or carbon monoxide gas, for example.

The gate electrode p-type GaN stack 124 etch process may also include an aluminum passivating species which may be implemented as oxygen radicals or fluorine radicals. The oxygen radicals may be provided by oxygen gas. The fluorine radicals may be provided by silicon hexafluoride, carbon tetrafluoride, or nitrogen trifluoride, for example.

The chemical etchant species binds to gallium atoms and nitrogen atoms in the gate layer. The physical etchant species impacts the gate layer and imparts sufficient energy to facilitate separation of the gallium atoms and nitrogen atoms that are bound to the chemical etchant species from the gate layer. The gallium atoms and nitrogen atoms that are separated from the gate layer are removed by the ICP etcher. The ICP etcher has a first power supply for forming a plasma which generates the chemical etchant species, the physical etchant species, and the aluminum passivating species, and a second power supply to independently control a potential difference between the plasma and the substrate 104. The first power supply may be operated at a power of 250 watts to 500 watts, for a 150 millimeter wafer, by way of example. The second power supply may be adjusted to operate initially at 20 watts to 100 watts, to provide an impact energy of the physical etchant species sufficient to facilitate separation of the gallium atoms and nitrogen atoms from the gate layer. As the gate etch process nears completion, the power level of the second power supply may be reduced, to 20 watts to 50 watts to reduce the energy provided for chemical reactions, which reduces removal of aluminum more significantly than removal of gallium, thus providing etch selectivity. Reducing the power level of the second power supply may thus decrease an etch rate of the optional etch stop layer 116, if present, or the barrier layer 112 if the optional etch stop layer 116, is not present, relative to the gate layer, because the gate layer includes more gallium and less aluminum than the optional etch stop layer 116 and the barrier layer 112.

The gate etch process may be performed at a pressure 10 millitorr to 50 millitorr, to improve the etching selectivity. The aluminum passivating species further improves the etching selectivity by combining preferentially with aluminum in the optional etch stop layer 116, if present, or in the barrier layer 112 if the optional etch stop layer 116, is not present, minimizing the sites available for the chemical etchant species to react with the gallium and nitrogen. Thus, the gate etch process may remove the gate layer completely where exposed by the gate mask, without removing a significant amount of the optional etch stop layer 116 or the barrier layer 112. The gate etch process may be continued in an over-etch step, after the gate layer is removed outside of the gate electrode p-type GaN stack 124. Reducing the power level of the second power supply and providing the aluminum passivating species may advantageously enable complete removal of the gate layer across the substrate 104, despite variations in thickness of the gate layer across the substrate 104, without removing a significant amount of the optional etch stop layer 116 or the barrier layer 112.

The 2DEG 114 includes a channel region 126 under the gate electrode p-type GaN stack 124. The free charge carrier density in the channel region 126 remains at the low value, because the thickness of the gate metal layer 122 and p-type GaN layer 120 remains constant in the gate electrode p-type GaN stack 124. The 2DEG 114 includes the source access region 128 and the drain access region 129, both adjacent to the channel region 126. As the gate layer is removed, the free charge carrier density in the 2DEG 114 increases in the source access region 128 and the drain access region 129, where the gate metal layer 122 and p-type GaN layer 120 are removed.

The 2DEG 114 includes a source region 130 in an area for a source of the GaN FET 102. The source region 130 is laterally separated from the channel region 126 by one of the source access regions 128. The 2DEG 114 includes a drain region 132 in an area for a drain of the GaN FET 102. The drain region 132 is laterally separated from the channel region 126 by the drain access region 129, and is located opposite from the source region 130.

The free charge carrier density of the 2DEG 114 in the source access region 128 and the drain access region 129 after the gate electrode p-type GaN stack 124 formation may increase to a value comparable to the free charge carrier density before the gate metal layer 122 and p-type GaN layer 120 were formed. The free charge carrier density of the 2DEG 114 in the source access region 128 and drain access region 129 may be $3\times10^{12}$ cm$^{-2}$ to $2\times10^{13}$ cm$^{-2}$, to provide the desired on-state resistance for the GaN FET 102. The channel region 126 of the 2DEG 114 retains a non-zero density of electrons, 1 percent to 75 percent of the free charge carrier density of the 2DEG 114 in the source access region 128 and the drain access region 129.

The bottom surface 136 of the gate electrode p-type GaN stack 124, adjacent to the barrier layer 112, does not extend past the top surface 138 of the barrier layer 112, located opposite from the channel layer 108, advantageously enabling the GaN FET 102 to be formed without a gate recess etch, which would increase fabrication cost and complexity. The GaN FET 102 may be free of any dielectric material between the gate electrode p-type GaN stack 124 and the barrier layer 112, advantageously enabling the GaN FET 102 to be formed without forming a gate dielectric layer, which would also increase fabrication cost and complexity. The GaN FET 102 may be free of III-N semiconductor material adjacent to the gate electrode p-type GaN stack 124, extending above the bottom surface 136 of the gate electrode p-type GaN stack 124, advantageously enabling the GaN FET 102 to be formed without forming a barrier regrowth layer, which would further increase fabrication cost and complexity. Other methods of forming the gate electrode p-type GaN stack 124 are within the scope of this disclosure.

The method 200 continues with step 220 which includes forming the dielectric layer 134 over the gate electrode p-type GaN stack 124 and over the barrier layer 112 adjacent to the gate electrode p-type GaN stack 124. The dielectric layer 134 may include one or more sublayers of silicon dioxide, silicon nitride, aluminum oxide, or any combination thereof. The dielectric layer 134 may be formed by one or more low pressure chemical vapor deposition (LPCVD) processes, plasma enhanced chemical vapor deposition (PECVD) processes, high density plasma (HDP) processes, or atomic layer deposition (ALD) processes, by way of example. The dielectric layer 134 may advantageously protect the gate electrode p-type GaN stack 124 and the barrier layer 112 from physical or chemical degradation.

The method 200 continues with step 222 which includes formation of the source contacts 144 to the source region 130, the drain contacts 142 to the drain region 132 and the gate contacts 143 to the gate electrode p-type GaN stack 124. The gate contacts 143 are formed through the dielectric layer 134, contacting the gate electrode p-type GaN stack 124. The gate contacts 143 may be aligned with an opening through the dielectric layer 134, or may extend partway over the dielectric layer 134 around the opening. Drain contacts 142 are formed through the dielectric layer 134 and the barrier layer 112, contacting the 2DEG 114 in the drain region 132. Source contacts 144 are formed through the dielectric layer 134 and the barrier layer 112, contacting the 2DEG 114 in the source region 130. The gate contacts 143, the drain contacts 142, and the source contacts 144 are electrically conductive, and may include one or more metals, such as titanium, tungsten, or aluminum, or may include other electrically conductive material such as carbon nanotubes or graphene.

Figure 3:
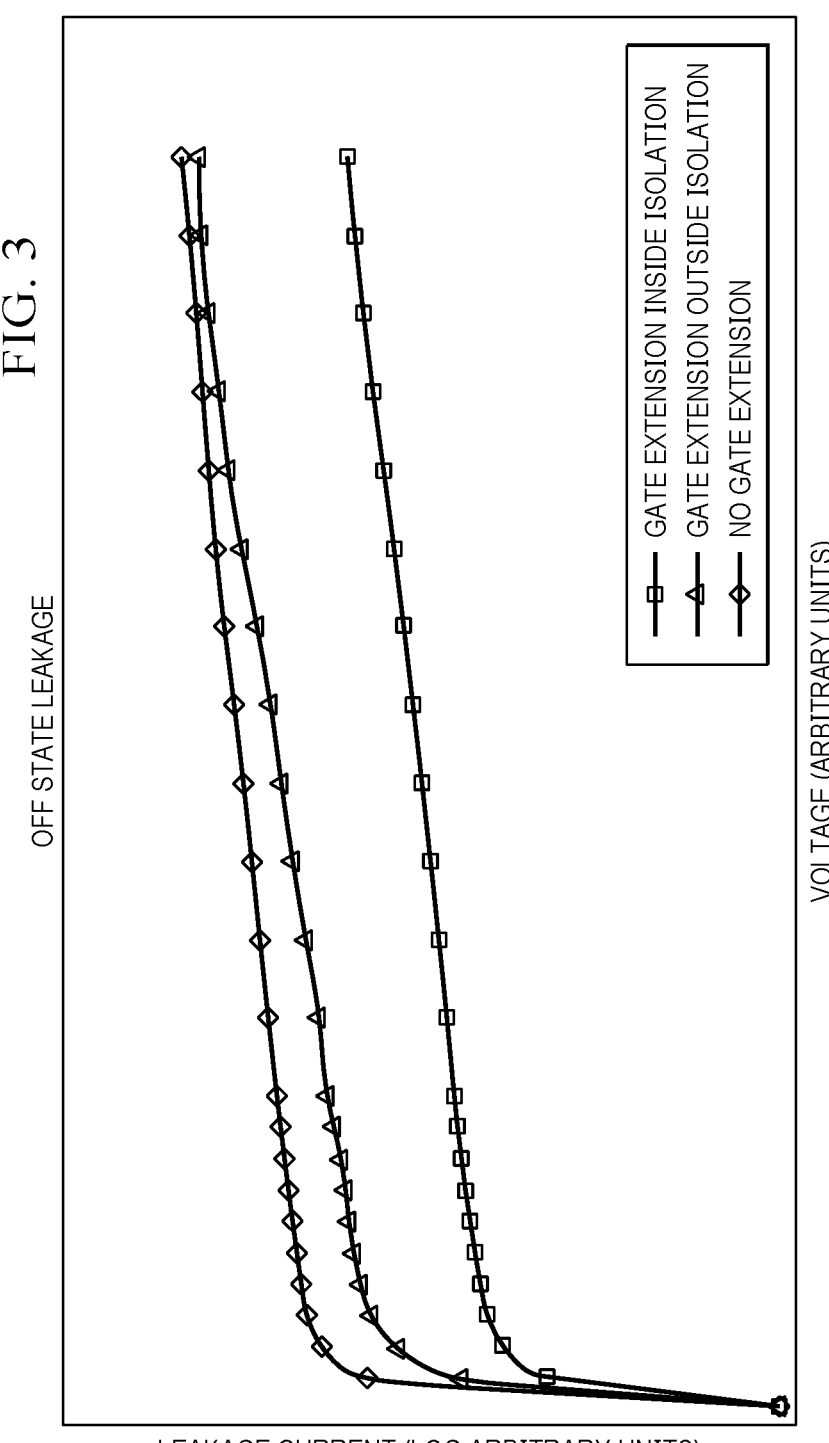
FIG. 3 is a graph demonstrating improved gate leakage of a GaN FET including a gate electrode extension inside the GaN FET isolation compared to a GaN FET with the gate electrode extension outside the GaN FET isolation and compared to a GaN FET without a gate electrode extension.

FIG. 3 is a graph comparing the off-state leakage for a no gate electrode extension GaN FET (not specifically shown), a GaN FET with a gate electrode extension outside the isolation of the GaN FET (not specifically shown) and the GaN FET 102 which contains a gate electrode extension 146 within the isolation region 145 of the GaN FET 102. It is advantageous for the gate electrode extension 146 of the gate electrode p-type GaN stack 124 to be within the isolation as the GaN FET 102 as the p-GaN of the gate electrode extension 146 is not damaged during the isolation implant and thus provides additional coupling between the gate electrode p-type GaN stack 124 and the source region 130 which results in lower off state leakage. When the gate electrode extension is outside of the isolation, the gate electrode extension coupling is reduced as the gate electrode extension is damaged during the isolation implant and the improvement in off state leakage is similar to a transistor with no gate electrode extension.

Figure 4:
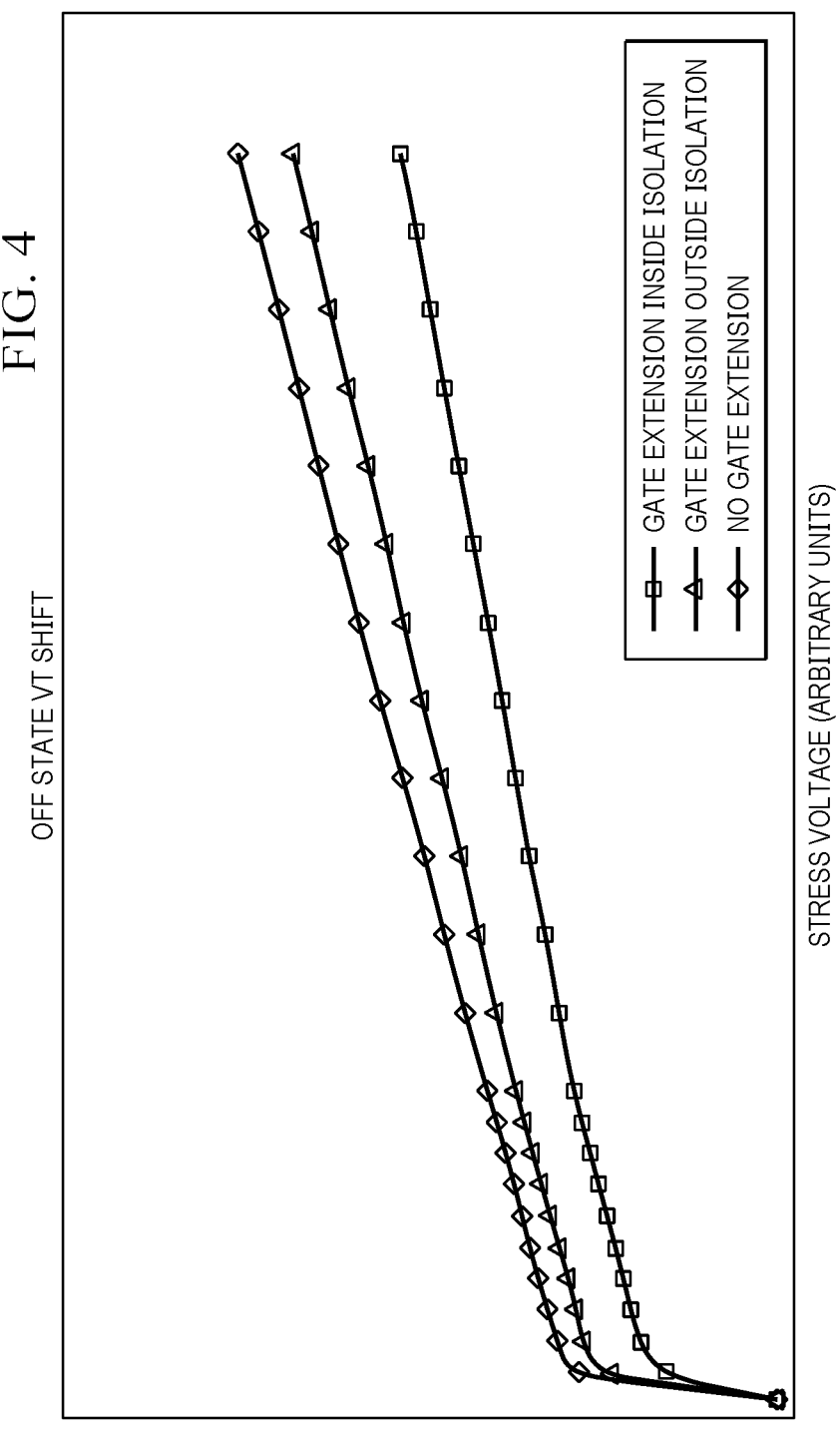
FIG. 4 is a graph demonstrating improved off-state Vt of a GaN FET including a gate electrode extension inside the GaN FET isolation compared to a GaN FET with the gate electrode extension outside the GaN FET isolation and compared to a GaN FET without a gate electrode extension.

FIG. 4 is a graph comparing the off state-Vt shift for a no gate electrode extension GaN FET (not specifically shown), a GaN FET with a gate electrode extension outside the isolation of the GaN FET (not specifically shown) and the GaN FET 102 which contains a gate electrode extension 146 within the isolation region 145 of the GaN FET 102. It is advantageous for the gate electrode extension 146 of the gate electrode p-type GaN stack 124 to be within the isolation as the GaN FET 102 as the p-GaN of the gate electrode extension 146 is not damaged during the isolation implant and thus provides additional coupling between the gate electrode p-type GaN stack 124 and the source region 130 which results in improved subthreshold characteristics. When the gate electrode extension is outside of the isolation, the gate electrode extension coupling is reduced as the gate electrode extension is damaged during the isolation implant and the improvement in off subthreshold voltage is similar to a transistor with no gate electrode extension.

Figure 5:
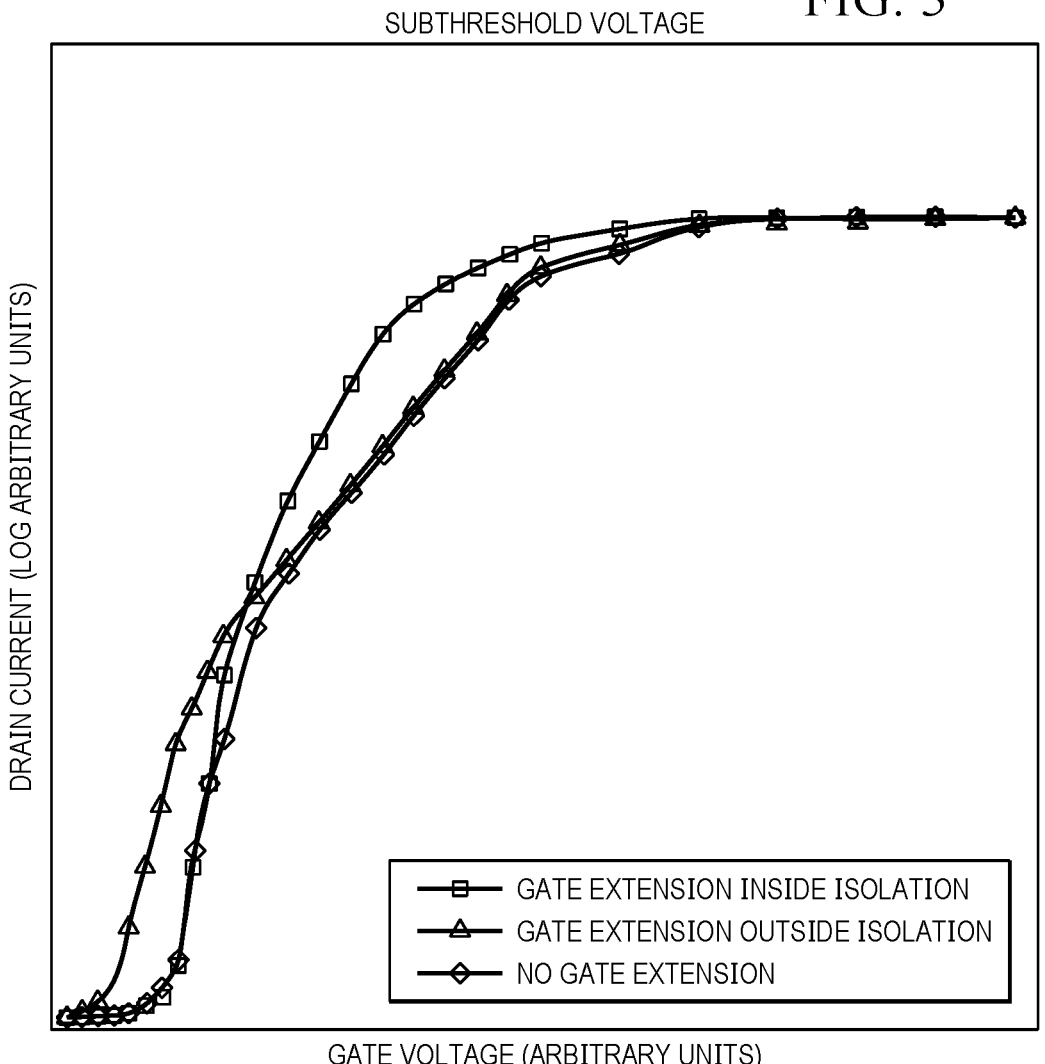
FIG. 5 is a graph demonstrating improved subthreshold voltage of a GaN FET including a gate electrode extension inside the GaN FET isolation compared to a GaN FET with the gate electrode extension outside the GaN FET isolation and compared to a GaN FET without a gate electrode extension.

FIG. 5 is a graph comparing the subthreshold voltage for a no gate electrode extension GaN FET (not specifically shown), a GaN FET with a gate electrode extension outside the isolation of the GaN FET (not specifically shown) and the GaN FET 102 which contains a gate electrode extension 146 within the isolation region 145 of the GaN FET 102. It is advantageous for the gate electrode extension 146 of the gate electrode p-type GaN stack 124 to be within the isolation as the GaN FET 102 as the p-GaN of the gate electrode extension 146 is not damaged during the isolation implant and provides a superior hole reservoir which can provide holes to the gate electrode p-type GaN stack 124 of the GaN FET 102 when it returns from an off state compared to a device in which the p-GaN extension is outside the isolation and damaged during the isolation formation, or the case when the device does not have a gate electrode extension.

While various examples of the present disclosure have been described above, it should be understood that they have been presented by way of example only and not limitation. Numerous changes to the disclosed examples can be made in accordance with the disclosure herein without departing from the spirit or scope of the disclosure. Thus, the breadth and scope of the present invention should not be limited by any of the above-described examples. Rather, the scope of the disclosure should be defined in accordance with the following claims and their equivalents.

What is claimed is:

1. A microelectronic device, comprising:
a gallium nitride field effect transistor (GaN FET), including:
a channel layer of III-N material;
a barrier layer of III-N material over the channel layer;
a p-type GaN layer on the barrier layer;
a gate metal layer on the p-type GaN layer;
a gate including a first portion of the p-type GaN layer and a first portion of the gate metal layer on the first portion of the p-type GaN layer; and
a p-type GaN gate electrode extension including a second portion of the p-type GaN layer and a second portion of the gate metal layer on the second portion of the p-type GaN layer, wherein,
the second portion of the p-type GaN layer is contiguous to the first portion of the p-type GaN layer, and the second portion of the gate metal layer is contiguous to the first portion of the gate metal layer; and
the p-type GaN gate electrode extension extends beyond the gate, but is inside of an isolation region laterally surrounding the GaN FET.

2. The microelectronic device of claim 1, wherein the GaN FET includes a high bandgap layer of III-N semiconductor material between the channel layer and the barrier layer.

3. The microelectronic device of claim 1, wherein the p-type GaN gate electrode extension is under a gate electrode bond pad of the GaN FET.

4. The microelectronic device of claim 1, wherein the GaN FET includes an etch stop layer disposed over the barrier layer.

5. The microelectronic device of claim 1, wherein the gate metal layer forms a Schottky contact on the p-type GaN layer.

6. The microelectronic device of claim 1, wherein the GaN FET is an enhanced mode transistor.

7. The microelectronic device of claim 1, wherein the GaN FET is a depletion mode transistor.

8. The microelectronic device of claim 1, wherein the isolation region includes an amorphous region of the barrier layer.

9. The microelectronic device of claim 1, wherein the isolation region is free of the barrier layer.

10. The microelectronic device of claim 1, wherein:
the gate of the GaN FET includes a first dimension extending between a source of the GaN FET and a drain of the GaN FET; and the p-type GaN gate electrode extension includes a second dimension parallel to the first dimension, the second dimension greater than the first dimension.

11. A method of forming a microelectronic device with a gallium nitride field effect transistor (GaN FET), comprising:

forming a channel layer of III-N semiconductor material;

forming a barrier layer of III-N semiconductor material over the channel layer;

forming a p-type GaN layer over the barrier layer;

forming a gate metal layer on the p-type GaN layer;

forming an isolation region encircling the GaN FET; and patterning the gate metal layer and the p-type GaN layer to form a gate of the GaN FET and a p-type GaN gate electrode extension contiguous to the gate, wherein:

the gate includes a first portion of the p-type GaN layer and a first portion of the gate metal layer; and the p-type GaN gate electrode extension extends beyond the gate, but is inside of the isolation region, the p-type GaN gate electrode extension including a second portion of the p-type GaN layer contiguous to the first portion of the p-type GaN layer and a second portion of the gate metal layer contiguous to the first portion of the gate metal layer.

12. The method of claim 11, further including forming a high bandgap layer of III-N semiconductor material between the channel layer and the barrier layer.

13. The method of claim 11, wherein the p-type GaN gate electrode extension is under a gate electrode bond pad of the GaN FET.

14. The method of claim 11, further including forming an etch stop layer over the barrier layer.

15. The method of claim 11, wherein the gate metal layer forms a Schottky contact to the p-type GaN layer.

16. The method of claim 11, wherein the GaN FET is an enhanced mode transistor.

17. The method of claim 11, wherein the GaN FET is a depletion mode transistor.

18. The method of claim 11, wherein the isolation region includes an amorphous region of the barrier layer.

19. The method of claim 11, wherein the isolation region is formed free of the barrier layer.

20. The method of claim 11, wherein:

the gate of the GaN FET includes a first dimension extending between a source of the GaN FET and a drain of the GaN FET; and the p-type GaN gate electrode extension includes a second dimension parallel to the first dimension, the second dimension greater than the first dimension.

* * * * *